US010262896B2

(12) United States Patent
Armini

(10) Patent No.: US 10,262,896 B2
(45) Date of Patent: Apr. 16, 2019

(54) FORMATION OF A TRANSITION METAL NITRIDE

(71) Applicant: IMEC VZW, Leuven (BE)

(72) Inventor: Silvia Armini, Heverlee (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/659,507

(22) Filed: Jul. 25, 2017

(65) Prior Publication Data

US 2018/0047621 A1  Feb. 15, 2018

(30) Foreign Application Priority Data

Aug. 9, 2016 (EP) .................................. 16183450

(51) Int. Cl.
| | |
|---|---|
| H01L 21/4763 | (2006.01) |
| H01L 23/48 | (2006.01) |
| H01L 21/768 | (2006.01) |
| H01L 23/522 | (2006.01) |
| H01L 23/532 | (2006.01) |
| C23C 16/02 | (2006.01) |
| C23C 16/04 | (2006.01) |
| C23C 16/34 | (2006.01) |
| C23C 16/56 | (2006.01) |

(52) U.S. Cl.
CPC .... H01L 21/76843 (2013.01); C23C 16/0272 (2013.01); C23C 16/045 (2013.01); C23C 16/34 (2013.01); C23C 16/56 (2013.01); H01L 21/76877 (2013.01); H01L 23/5226 (2013.01); H01L 23/53238 (2013.01)

(58) Field of Classification Search
CPC ......... H01L 21/76843; H01L 21/76877; H01L 23/5226; H01L 23/53238; C23C 16/0272; C23C 16/045; C23C 16/34
See application file for complete search history.

(56) References Cited

U.S. PATENT DOCUMENTS

| | | | | |
|---|---|---|---|---|
| 2004/0207084 | A1* | 10/2004 | Hedrick | H01L 21/3121 257/751 |
| 2005/0206004 | A1* | 9/2005 | Cohen | H01L 21/02126 257/758 |
| 2006/0197224 | A1* | 9/2006 | Hedrick | H01L 21/3121 257/751 |
| 2008/0254614 | A1* | 10/2008 | Hedrick | H01L 21/3121 438/627 |

(Continued)

FOREIGN PATENT DOCUMENTS

WO   WO 2014/118751 A1   8/2014

OTHER PUBLICATIONS

Au et al., "Selective Chemical Vapor Deposition of Manganese Self-Aligned Capping Layer for Cu Interconnections in Microelectronics", *Journal of the Electrochemical Society*, 157, 6, D341-D345, 2010.

(Continued)

*Primary Examiner* — Alonzo Chambliss
(74) *Attorney, Agent, or Firm* — Knobbe Martens Olson & Bear, LLP

(57) ABSTRACT

A use of an amine-containing silane for forming a transition metal nitride is provided. In this use, the amine of the amine-containing silane is the source of at least some, preferably most and most preferably all of the nitrogen present in the transition metal nitride.

14 Claims, 3 Drawing Sheets

(56) References Cited

U.S. PATENT DOCUMENTS

| | | |
|---|---|---|
| 2011/0163062 A1 | 7/2011 | Gordon et al. |
| 2013/0334700 A1 | 12/2013 | Singh et al. |
| 2016/0194755 A1 | 7/2016 | Wiese et al. |

OTHER PUBLICATIONS

Ek et al., "Atomic Layer Deposition of Amino-Functionalized Silica Surfaces Using N-(2Aminoethyl)-3-aminopropyltrimethoxysilane as a Silylating Agent", J. Phys. Chem. B 2004, 108, 9650-9655.

* cited by examiner

FORMATION OF A TRANSITION METAL NITRIDE

INCORPORATION BY REFERENCE TO RELATED APPLICATION

Any and all priority claims identified in the Application Data Sheet, or any correction thereto, are hereby incorporated by reference under 37 CFR 1.57. This application claims the benefit of EP Application No. 16183450.2, filed on Aug. 9, 2016. The aforementioned application is incorporated by reference herein in its entirety, and is hereby expressly made a part of this specification.

FIELD OF THE INVENTION

Transition metal nitrides and in particular to the transition metal nitrides usable in barrier layers, used in the fabrication of interconnections in integrated circuits are provided.

BACKGROUND OF THE INVENTION

Within the field of (metal) interconnect fabrication in integrated circuits, transition metal layers, such as layers comprising manganese, are very interesting as barrier layers. US20110163062 A1 for example describes the use of manganese, chromium, vanadium or cobalt layers for preventing copper diffusion out of the wires. The significance of these transition metal layers is mainly owed to them being very conformal layers, which are self-forming and which can be scaled down to sub-2 nm thickness.

These transition metal films may be either in the form of the metallic transition metal or in the form of a transition metal compound. On silicon oxide, the mechanism of manganese barrier formation involves the formation of manganese silicate. On a low-k material however, this is much more difficult, due to a reduced number of available oxygen sites, and only happens upon annealing above 200° C. Furthermore, if the low-k material is porous, manganese easily diffuses into the pores. Apart from diffusion into the low-k material, the manganese also readily diffuses into the copper; resulting in an increased copper resistivity and a loss of barrier properties.

SUMMARY OF THE INVENTION

There is thus still a need within the art for methods of forming transition metal compounds, usable as barrier layers, where the transition metal is sufficiently immobilized in the layer.

It is an object of the embodiments to provide good methods for forming transition metal nitrides, usable as barrier layers.

It is an advantage of embodiments that the transition metal nitrides can be used as barrier layers for (metal) interconnects in integrated circuits. It is a further advantage of embodiments that these (metal) interconnects may be made using a damascene process. A damascene process is a process where openings such as vias or trenches are cut into a dielectric material and then filled with fill metal, typically followed by removing the excess metal over the dielectric material surface, to form desired interconnect metal patterns within the openings.

It is an advantage of embodiments that the transition metal is hindered from diffusing into a low-k material or copper, and typically both.

It is an advantage of embodiments that the formation of the barrier layer is compatible with the use of porous low-k materials.

It is an advantage of embodiments that the formation of the barrier layer is compatible with the use of high carbon/low oxygen low-k materials.

The above objective is accomplished by a use and a method according to the embodiments.

In a first aspect, use is provided of an amine-containing silane for forming a transition metal nitride. In this use, the amine of the amine-containing silane is the source of at least some, preferably most and most preferably all of the nitrogen present in the transition metal nitride.

In a second aspect, a method is provided for forming a barrier layer against the diffusion of a fill metal, comprising the steps of:
 a. providing a substrate comprising a dielectric material region,
 b. contacting an amine-containing silane with the dielectric material region,
 c. reacting a transition metal or transition metal precursor with the amine-containing silane, with the proviso that the transition metal precursor is not a manganese nitride, thereby forming a transition metal nitride.

In an embodiment, a method is provided for forming a barrier layer useable in a formation of interconnects, comprising the steps of:
 a. providing a substrate comprising a low-k material,
 b. contacting an amine-containing silane with the low-k material,
 c. contacting a transition metal or transition metal precursor with the amine-containing silane, with the proviso that the transition metal precursor is not a manganese nitride, and
 d. optionally, heating up the transition metal or transition metal precursor.

In a third aspect, a structure is provided for use in a formation of interconnects, obtainable by the method according to embodiments of the second aspect.

In embodiments of the third aspect, a structure is provided for use in a formation of interconnects, comprising:
 i. a substrate comprising a dielectric material region comprising an opening;
 ii. a barrier layer comprising a transition metal nitride, the barrier layer overlaying the opening and being obtainable by first contacting an amine-containing silane with the dielectric material region, and second reacting a transition metal or transition metal precursor with the amine-containing silane, with the proviso that the transition metal precursor is not a manganese nitride.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

DESCRIPTION OF ILLUSTRATIVE EMBODIMENTS

Figure 1:
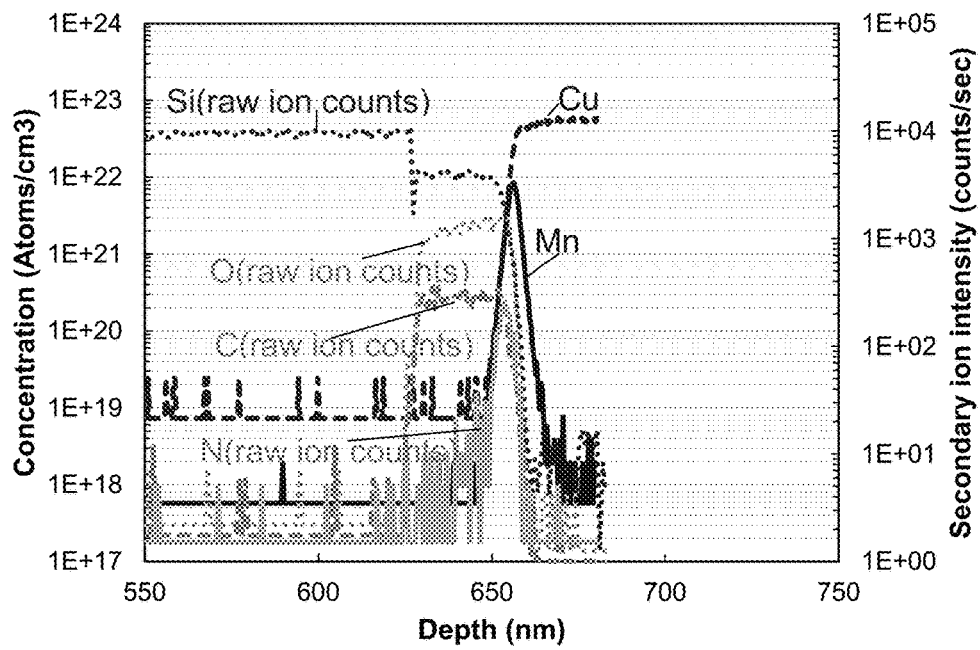
FIGS. 1 and 2 show backside secondary ion mass spectrometry (SIMS) spectra of samples without (FIG. 1) and with (FIG. 2) amine-containing silane, in accordance with an embodiment.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms "first", "second", "third" and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms "top", "bottom", "over", "under" and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Where a range of values is provided, it is understood that the upper and lower limit, and each intervening value between the upper and lower limit of the range is encompassed within the embodiments.

All references cited herein are incorporated herein by reference in their entirety. To the extent publications and patents or patent applications incorporated by reference contradict the disclosure contained in the specification, the specification is intended to supersede and/or take precedence over any such contradictory material. The following terms are provided solely to aid in the understanding of the invention.

As used herein, and unless provided otherwise, a barrier layer is a layer which prevents the diffusion of a material across it. In particular, a barrier layer in a damascene process for the formation of interconnects is a barrier layer which prevents the diffusion of a fill metal, e.g. copper, ruthenium, nickel or tungsten, into a dielectric material, e.g. a low-k material.

As used herein, and unless provided otherwise, a transition metal precursor is a transition metal compound serving as a source of the transition metal. In the present invention, transition metal precursors are capable of reacting with primary or secondary amino groups to form transition metal nitrides.

In a first aspect, a use is provided of an amine-containing silane for forming a transition metal nitride. In this use, the amine of the amine-containing silane is the source of at least some, preferably most and most preferably all of the nitrogen present in the transition metal nitride.

The amine-containing silane is an organosilane and may typically comprise a primary or secondary amine functional group. In preferred embodiments, the amine-containing silane may comprise a plurality of amine functional groups, such as a plurality of primary and/or secondary amine functional groups. It was surprisingly found that the one or more amine functional groups comprised in a silane advantageously act as source of nitrogen for the formation of the transition metal nitride. The silane advantageously allows the formation of a self-assembled monolayer (SAM). The SAM typically has a thickness below 5 nm, preferably below 1 nm. A layer of the silane, such as a SAM, can advantageously partially seal the pores of a porous material, such as a porous low-k material, and thereby help prevent diffusion of the transition metal therein.

In embodiments, the silane may be of general formula R—SiOR'$_3$ wherein R is a hydrocarbyl group comprising one or more primary and/or secondary amine functional groups and R' is an alkyl. The amine-containing silane may for example be a [3-(2-aminoethylamino)propyl]trimethoxysilane (DETA) or a (3-aminopropyl)trimethoxysilane (APTMS). In other embodiments, the silane may be of general formula R—SiCl$_3$ wherein R is a hydrocarbyl group comprising one or more protected primary and/or secondary amine functional groups and R' is an alkyl. In these other embodiments, the protected primary and/or secondary amine functional groups can be later deprotected, after the —SiCl$_3$ group has been anchored to the substrate.

In embodiments, the transition metal nitride may be a nitride of a transition metal belonging to a group from group 4 to group 9 of the periodic table of the elements, preferably from group 7 to group 9. In preferred embodiments, the metal is selected in such a group and in a period selected from periods 4 to 6.

In embodiments, the transition metal nitride may be a manganese nitride ($Mn_xN_y$), a cobalt nitride ($Co_xN_y$), a ruthenium nitride ($Ru_xN_y$), a chromium nitride ($Cr_xN_y$), a vanadium nitride ($V_xN_y$), a titanium nitride ($Ti_xN_y$) or a tantalum nitride ($Ta_xN_y$). In preferred embodiments, the transition metal nitride may be a manganese nitride ($Mn_xN_y$), a cobalt nitride ($Co_xN_y$) or a ruthenium nitride ($Ru_xN_y$). In yet more preferred embodiments, the transition metal nitride may be a manganese nitride ($Mn_xN_y$). The values for X and Y can vary since typically one or more metal nitride compound are formed. For instance, in the case of manganese nitride, one or more of MnN, $Mn_4N$, $Mn_3N_2$, $Mn_2N$ may be formed. Manganese nitride, cobalt nitride and ruthenium nitride are particularly useful in the formation of a barrier layer, such as a barrier layer for use in a damascene process. The use of manganese compounds in barrier layers is well known within the art; the use of cobalt compounds for this purpose is emerging. Furthermore, the chemistry of both cobalt and ruthenium is similar to that of manganese. It is well known within the art that transition metal nitrides advantageously have better adhesion properties to dielectrics, as compared to the pure transition metal. Good adhesion is a useful property for forming a good barrier layer. Certain embodiments may relate to the use of an amine-containing silane for forming a transition metal nitride forming at least part of a barrier layer against the diffusion of a fill metal in a damascene process. In preferred embodiments, this fill metal is copper.

In embodiments, the amine-containing silane may be in contact with a dielectric material. For example, the amine-containing silane may form a layer, such as a SAM, in contact with the dielectric material. In preferred embodiments, the dielectric material may be a low-k material. For example, the amine-containing silane may form a layer, such as a SAM, in contact with the low-k material. Typically, the amine-containing silane may be chemically reacted with the dielectric material. Typically, the amine-containing silane may be chemically bound to the dielectric material. In embodiments, the amine-containing silane may be reacted with a dielectric material so that the silicon atom of the silane is bound to the dielectric material and the one or more amine groups are not reacted and are available for the reaction with the transition metal or transition metal precursor. In embodiments, the low-k material may be a porous low-k material. The low-k material may typically have a dielectric constant of 3.0 or below, preferably from 2.1 to 2.8, such as from 2.3 to 2.5. In embodiments, the dielectric material may be a silicon-based material, such as an organosilicate. In embodiments, the silicon-based low-k material may have a carbon content of 25% or more and/or an oxygen content of 10% or less; where the carbon and oxygen content are expressed in atomic percent, i.e. as the number fraction of the respective atom to the total number of atoms in the material. The embodiments are particularly advantageous when used in combination with silicon-based low-k materials having a high carbon and/or low oxygen content. In this type of low-k material, there are otherwise typically too few reactive sites, such as oxygen sites, to directly form a good, immobilized transition metal barrier between the transition metal (compound) and the low-k material. Furthermore, high carbon content low-k materials are the current industry standard. In preferred embodiments, the low-k material may have a hydrophilic surface. A hydrophilic surface of a low-k material typically comprises groups, such as hydroxide groups, which can react with the silane. The silane may for example form a covalent —Si—O—Si—bond with a silicon-based low-k material. A low-k material, such as a silicon-based low-k material, may typically be made more hydrophilic by a short exposure to a $CO_2$ plasma.

In embodiments, the formation of the transition metal nitride may comprise contacting a transition metal or transition metal precursor with the amine-containing silane. Contacting may for example be achieved by depositing the transition metal or transition metal precursor on the amine-containing silane, e.g. by means of physical vapor deposition (PVD), chemical vapor deposition (CVD) or atomic layer deposition (ALD), or by exposing the amine-containing silane to a solution comprising the transition metal or transition metal precursor, such as a solution in an organic solvent, e.g. by dipping or by spin coating. In embodiments, the formation of the transition metal nitride may comprise a chemical reaction between the transition metal or transition metal precursor and the amine-containing silane. In embodiments, the formation of the transition metal nitride may comprise annealing the transition metal or transition metal precursor after the contacting, e.g. to initiate a chemical reaction between the transition metal or transition metal precursor and the amine-containing silane. In embodiments, annealing the transition metal or transition metal precursor may be performed at a temperature from 150° C to 450° C., preferably from 200° C to 400° C. In preferred embodiments, the transition metal may be manganese, cobalt or ruthenium. In other embodiments, the transition metal precursor may be a compound, such as a manganese compound, a cobalt compound or a ruthenium compound. As an example of manganese compound, manganese amidinate could be used. In some embodiments, a plurality of transition metal and/or transition metal precursors may be contacted; for example, both manganese or a manganese precursor and ruthenium or a ruthenium precursor may be contacted.

In embodiments, the use may further be for spatially confining, e.g. hindering the diffusion of, a transition metal compound. The transition metal compound may for example be manganese, a manganese nitride, a manganese silicate or a manganese-copper compound. In embodiments, the transition metal compound may be spatially confined outside the low-k material. Spatially confining the transition metal compound advantageously maintains the good barrier properties. In embodiments, the damascene process may use a fill metal, such as copper, and the transition metal compound may be spatially confined outside the fill metal. Spatially confining the transition metal compound outside the fill metal advantageously maintains the conductivity of the fill metal.

Figure 6:
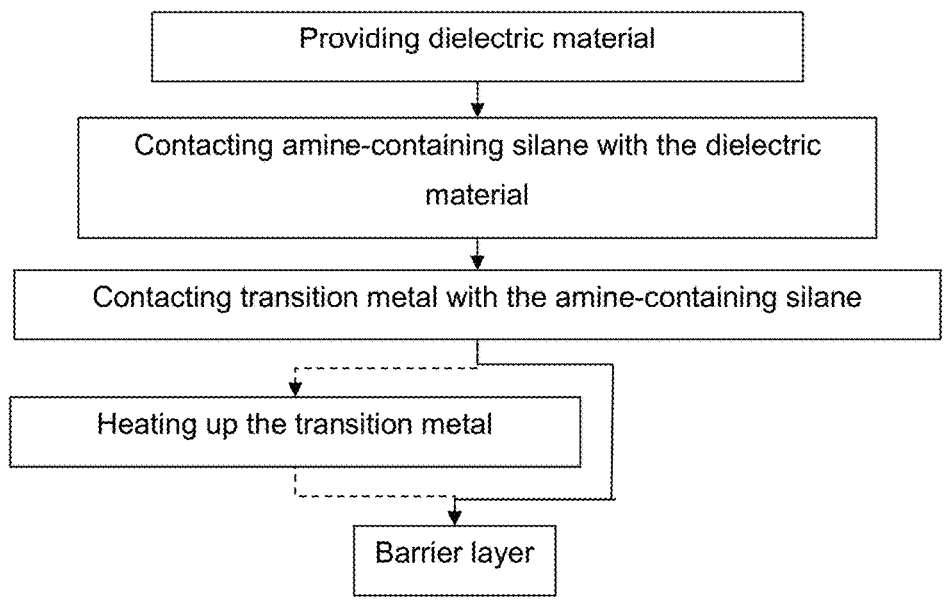
FIG. 6 is a flowchart describing a method according to an embodiment of the third aspect.

In a second aspect (FIG. 6), a method is provided for forming a barrier layer against the diffusion of a fill metal, comprising the steps of:
  a. providing a substrate comprising a dielectric material region,
  b. contacting an amine-containing silane with the dielectric material region,
  c. reacting a transition metal or transition metal precursor with the amine-containing silane, with the proviso that the transition metal precursor is not a manganese nitride, thereby forming a transition metal nitride.

In embodiments, step b of contacting the amine-containing silane with the dielectric material region may be reacting the amine-containing silane with the low-k material region.

In embodiments, step c of reacting the transition metal or transition metal precursor with the amine-containing silane may comprise the steps c1) of contacting the transition metal or transition metal precursor with the amine containing silane, followed by c2) exposing the transition metal or transition metal precursor to a temperature above room temperature (e.g., 20 to 25° C., for example 23° C.).

In embodiments, this temperature may be from 150° C. to 450° C., preferably from 200° C. to 400° C.

In embodiments, the formation of interconnects may comprise a damascene process.

In embodiments, step c may be with the proviso that the transition metal precursor is not a transition metal nitride.

In embodiments, the dielectric material region may comprise an exposed opening. For instance, it may comprise a trench or a via.

In embodiments, the substrate may additionally comprise a semiconductor substrate. In embodiments, the semiconductor substrate may comprise a semiconductor device, such as a transistor or a memory device.

Contacting the transition metal or transition metal precursor with the amine-containing silane may for example be achieved by depositing the transition metal or transition metal precursor on the amine-containing silane, e.g. by means of physical vapor deposition (PVD), chemical vapor deposition (CVD) or atomic layer deposition (ALD), or by exposing the amine-containing silane to a solution comprising the transition metal or transition metal precursor, such as a solution comprising an organic solvent, e.g. by dipping or by spin coating.

Contacting the amine-containing silane with the dielectric material may for example be achieved by depositing the amine-containing silane on the dielectric material, e.g. by means of physical vapor deposition (PVD), chemical vapor deposition (CVD) or atomic layer deposition (ALD), or by exposing the dielectric material to a solution comprising the amine-containing silane, such as a solution comprising an organic solvent, e.g. by dipping or by spin coating.

In embodiments, contacting the transition metal or the transition metal precursor with the amine-containing silane may comprise a chemical reaction between the transition metal or transition metal precursor and the amine-containing silane. In embodiments, heating up the transition metal or transition metal precursor may lead to a chemical reaction between the transition metal or transition metal precursor and the amine-containing silane. In embodiments, the chemical reaction may form a transition metal nitride. In preferred embodiments, the transition metal may be manganese, cobalt or ruthenium. In other embodiments, the transition metal precursor may be a compound, such as a manganese compound, a cobalt compound or a ruthenium compound.

In embodiments, the barrier layer, the damascene process, the low-k material, the contacting, the amine-containing silane, the transition metal or transition metal precursor and the annealing may be as previously described for the first aspect.

In a third aspect, a structure is provided for use in a formation of interconnects, obtainable by the method according to embodiments of the second aspect.

In embodiments of the third aspect, a structure is provided for use in a formation of interconnects, comprising:
  i. a substrate comprising a dielectric material region comprising an opening;
  ii. a barrier layer comprising a transition metal nitride, the barrier layer overlaying the opening and being obtainable by first contacting an amine-containing silane with the dielectric material region, and second reacting a transition metal or transition metal precursor with the amine-containing silane, with the proviso that the transition metal precursor is not a manganese nitride.

In an embodiment of the third aspect, a structure is provided for use in a formation of interconnects, comprising:
  i. a substrate comprising a low-k material, the low-k material having a pattern defined therein and thereby comprising at least one opening;
  ii. a layer of amine-containing silane covering the low-k material in the at least one opening;
  iii. a barrier layer comprising at least a transition metal nitride other than manganese nitride covering the layer of amine-containing silane in the at least one opening.

In an embodiment of the third aspect, a structure is provided for use in a formation of interconnects, comprising:
  i. a substrate comprising a low-k material, the low-k material having a pattern defined therein and thereby comprising at least one opening;
  ii. a layer of amine-containing silane covering the low-k material in the at least one opening;
  iii. a barrier layer comprising at least a cobalt nitride or a ruthenium nitride covering the layer of amine-containing silane in the at least one opening.

In embodiments, features of the third aspect may be in accordance with corresponding features of any of the previous aspects and their embodiments.

In a particular embodiment, the transition metal may be selected from cobalt and ruthenium.

The invention will now be described by a detailed description of several embodiments of the invention. It is clear that other embodiments of the invention can be configured according to the knowledge of the person skilled in the art without departing from the true technical teaching of the invention, the invention being limited only by the terms of the appended claims.

EXAMPLE 1

Formation of a Manganese Nitride Barrier Layer for Use in a Damascene Process

A plasma-enhanced chemical vapour deposited (PECVD) substrate was provided having a layer of porous silicon-based low-k material thereon. The porous silicon-based low-k material had a dielectric constant of 2.4. A pattern of trenches was defined in the layer of low-k material. The exposed surfaces, such as the side walls of the trenches, were then made more hydrophilic by a 2 to 3 s exposure to a $CO_2$ plasma. A SAM of DETA was formed, either from the liquid phase or from the vapour phase, on the side walls of the trenches, at least partially sealing the pores of the porous low-k material. Subsequently, manganese (example 1a) or manganese nitride (example 1 b) was deposited on the SAM using chemical vapour deposition and a 200-400° C. thermal annealing was performed to complete the reaction of the manganese with the SAM; thereby forming a manganese barrier layer comprising manganese nitride. Finally, copper was deposited inside the trenches covered with the manganese barrier layer. This deposition was performed by means of a damascene process.

For comparison, the same process was repeated but the SAM was omitted.

Figure 2:
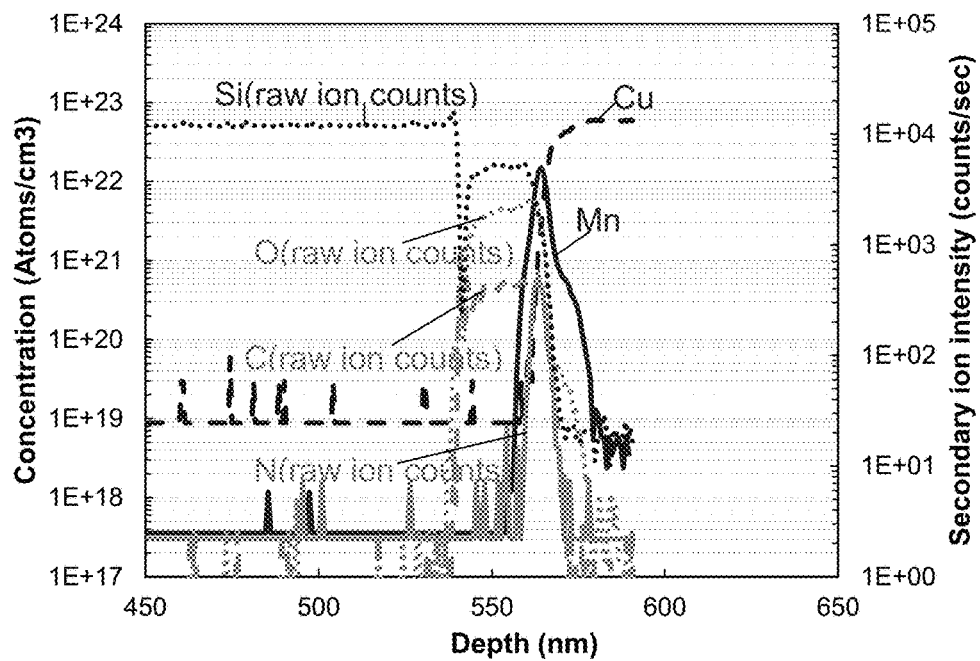

Referring to FIGS. 1 and 2, backside secondary ion mass spectrometry (SIMS) spectra of the samples, obtained by depositing manganese nitride (example 1 b), without (FIG. 1) and with (FIG. 2) SAM were taken. The presence of Mn in both the low-k material and the copper layer, i.e. outside the manganese barrier layer, was observed when no SAM was present. Conversely, when the SAM was present, the presence of the Mn was bound to the manganese barrier layer and no Mn was observed in either the low-k material or in the copper layer. These results show that the presence of the SAM leads to the spatial confinement of Mn inside the barrier layer. This result is also expected for example 1a since in that case $Mn_XN_Y$ is formed in situ in presence of the same SAM.

Figure 3:
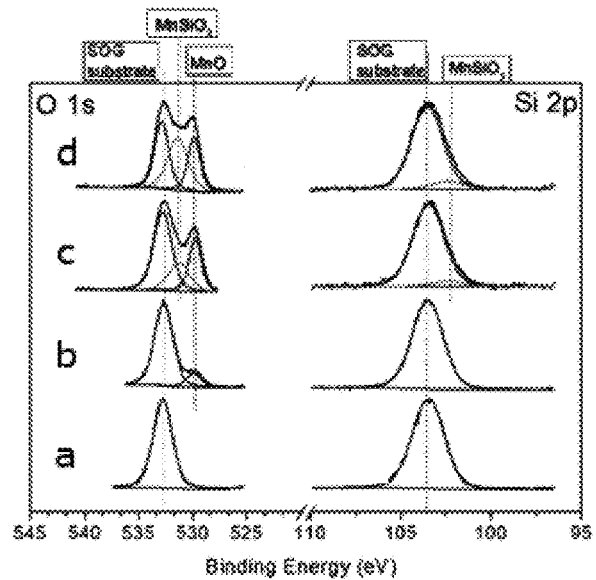
FIGS. 3 to 5 show silicon (FIGS. 3 and 4) and nitrogen (FIG. 5) XPS chemical analysis data on samples, without (FIG. 3) and with (FIGS. 4 and 5) amine-containing silane, during different steps of the sample formation; in accordance with an embodiment.
Figure 4:
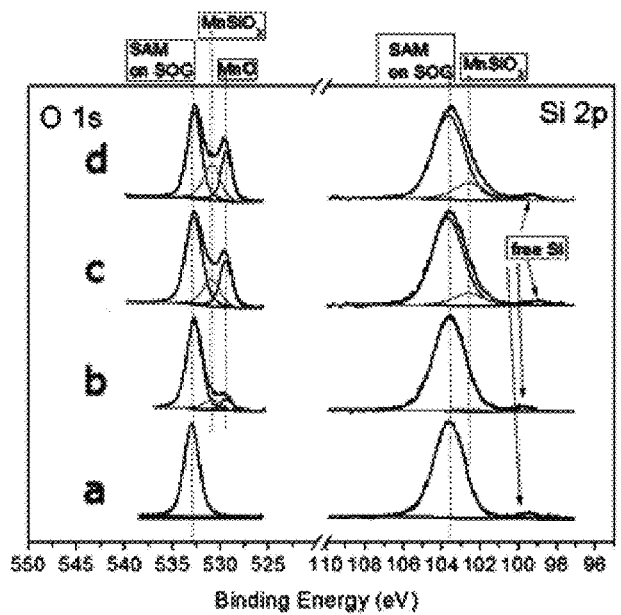
Figure 5:
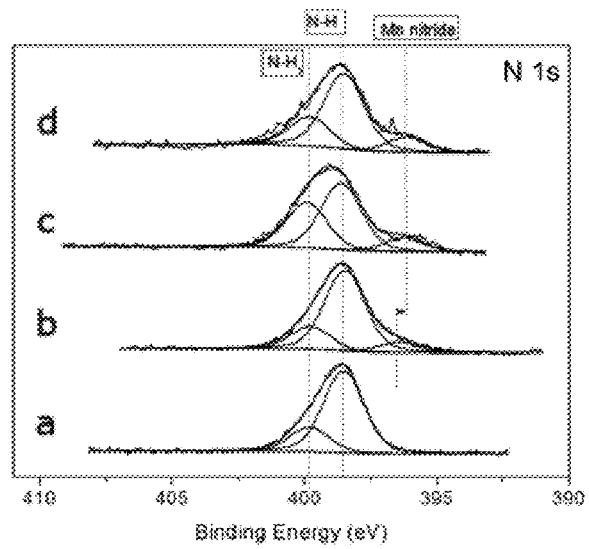

Referring to FIGS. 3 to 5, silicon (FIGS. 3 and 4) and nitrogen (FIG. 5) XPS chemical analysis data are shown on samples, obtained by depositing manganese (example 1a), without (FIG. 3) and with SAM (FIGS. 4 and 5) during different steps of the sample formation: a) the low-k material on SOG as loaded, further comprising the SAM (if present), b) after manganese deposition, c) after annealing at 200° C. and d) after annealing at 400° C. In the absence of the SAM (FIG. 3), no $MnSiO_3$ formation could be observed prior to annealing; whereas in the presence of the SAM (FIG. 4) already some $MnSiO_3$ formation could be observed upon manganese deposition, further increasing after annealing. Similarly, in the presence of the SAM, $Mn_xN_y$ is formed upon manganese deposition, with a slight additional increase after annealing. These results indicate the confinement of the manganese to the dielectric/barrier interface and improved manganese silicate formation in the presence of the SAM.

EXAMPLE 2

Formation of a Ruthenium Nitride Barrier Layer for Use in a Damascene Process

A substrate was provided having a layer of porous organo-silicate low-k material thereon. In one case, the low-k material had a dielectric constant of 2.4; in another, the dielectric constant was 2.55. A pattern of trenches and vias was defined in the layer of low-k material. The exposed surfaces, such as the side walls of the trenches, were then made more hydrophilic by a 2 to 3 s exposure to a $CO_2$ plasma. A SAM of DETA was formed, from the vapour phase, on the side walls of the trenches, at least partially sealing the pores of the porous low-k material. Subsequently, a 20-25 nm thick layer of ruthenium was deposited on the SAM using atomic layer deposition and a 200-400° C. thermal annealing was performed to complete the reaction of the ruthenium with the SAM. Finally, copper was deposited inside the trenches covered with the ruthenium barrier layer. This deposition was performed by means of a (dual) damascene process.

It is to be understood that although preferred embodiments, specific constructions and configurations, as well as materials, have been discussed herein for devices according to the present invention, various changes or modifications in form and detail may be made without departing from the scope and technical teachings of this invention. For example, any formulas given above are merely representative of procedures that may be used. Functionality may be added or deleted from the block diagrams and operations may be interchanged among functional blocks. Steps may be added or deleted to methods described within the scope of the present invention.

What is claimed is:

1. A method for forming a barrier layer against diffusion of a fill metal, comprising:
    providing a substrate comprising a dielectric material region;
    contacting an amine-containing silane with the dielectric material region; and
    reacting a transition metal or a transition metal precursor with the amine-containing silane, with the proviso that the transition metal precursor is not a manganese nitride, whereby a transition metal nitride is formed, wherein the reacting the transition metal or the transition metal precursor with the amine-containing silane comprises:
        contacting the transition metal or the transition metal precursor with the amine containing silane; and thereafter
        exposing the transition metal or the transition metal precursor to a temperature above room temperature.
2. The method of claim 1, wherein the temperature is from 150° C. to 450° C.
3. The method of claim 1, wherein the temperature is from 200° C. to 400° C.
4. The method of Claim 1, wherein the transition metal is selected from the group consisting of manganese, cobalt, and ruthenium.
5. The method of claim 1, wherein the dielectric material region is a low-k dielectric material region.
6. The method of claim 5, wherein the low-k dielectric material is a silicon-based low-k material.

7. The method of claim 6, wherein the silicon-based low-k material has a carbon content of 25 at. % or more.

8. The method of claim 6, wherein the silicon-based low-k material has an oxygen content of 10 at. % or lower.

9. The method of claim 1, wherein the transition metal nitride forms at least part of a barrier layer against diffusion of a fill metal in a damascene process.

10. The method of claim 9, wherein the fill metal is copper.

11. The method of claim 10, wherein the amine-containing silane is [3-(2-aminoethylamino)propyl]trimethoxysilane or (3-aminopropyl)trimethoxysilane.

12. The method of claim 1, wherein the dielectric material region comprises an exposed opening.

13. A structure for use in a formation of interconnects, comprising:
   a substrate comprising a dielectric material region, the dielectric material region comprising an opening; and
   a barrier layer comprising a transition metal nitride, the barrier layer overlaying the opening and being formed by first contacting an amine-containing silane with the dielectric material region, and then reacting a transition metal or a transition metal precursor with the amine-containing silane, with the proviso that the transition metal precursor is not a manganese nitride,
   wherein the structure is prepared according to the method of claim 1.

14. The structure of claim 13, wherein the transition metal is selected from the group consisting of cobalt and ruthenium.

\* \* \* \* \*